United States Patent [19]

Nagano

[11] Patent Number: 5,613,295
[45] Date of Patent: Mar. 25, 1997

[54] SEMICONDUCTOR DEVICE HAVING AN INTERCONNECTING CIRCUIT BOARD AND METHOD FOR MANUFACTURING SAME

[75] Inventor: Junya Nagano, Kanagawa-ken, Japan

[73] Assignee: Kabushiki Kaisha Toshiba, Kanagawa-ken, Japan

[21] Appl. No.: 460,734

[22] Filed: Jun. 2, 1995

Related U.S. Application Data

[62] Division of Ser. No. 253,589, Jun. 3, 1994, Pat. No. 5,473,514, which is a continuation of Ser. No. 808,848, Dec. 17, 1991, abandoned.

[30] Foreign Application Priority Data

Dec. 20, 1990 [JP] Japan .................................. 2-404429
Dec. 10, 1991 [JP] Japan .................................. 3-326148

[51] Int. Cl.$^6$ ................................................ H01R 43/00
[52] U.S. Cl. ................................................ 29/827; 29/832
[58] Field of Search ................................ 24/827, 832, 846, 24/850; 361/813; 257/666, 671, 676, 686, 777; 174/52.1, 52.4; 437/208, 915

[56] References Cited

U.S. PATENT DOCUMENTS

| 4,472,876 | 9/1984 | Nelson .................................. 361/749 |
| 4,714,952 | 12/1987 | Takekawa et al. ...................... 361/813 |
| 4,751,482 | 6/1988 | Fukuta et al. .......................... 174/52.4 |
| 4,801,999 | 1/1989 | Hayward et al. ....................... 257/666 |
| 5,010,390 | 4/1991 | Tanaka ................................... 257/676 |
| 5,012,323 | 4/1991 | Farnworth .............................. 357/723 |
| 5,150,194 | 9/1992 | Brooks et al. .......................... 257/666 |
| 5,220,486 | 6/1993 | Takubo et al. ......................... 257/666 |

FOREIGN PATENT DOCUMENTS

| 0375869 | 7/1990 | European Pat. Off. . |
| 0409173 | 1/1991 | European Pat. Off. . |
| 4010644 | 8/1991 | Germany ............................... 257/690 |
| 0020699 | 9/1969 | Japan .................................... 174/52.4 |
| 53-39891 | 4/1978 | Japan .................................... 257/666 |
| 53-124070 | 10/1978 | Japan .................................... 437/209 |
| 57-035361 | 6/1982 | Japan . |
| 58-154240 | 9/1983 | Japan .................................... 257/692 |
| 60-14460 | 1/1985 | Japan .................................... 257/666 |
| 60-79733 | 5/1985 | Japan .................................... 257/666 |
| 61-32534 | 2/1986 | Japan .................................... 257/676 |
| 61-64133 | 4/1986 | Japan .................................... 257/666 |
| 61-137334 | 6/1986 | Japan .................................... 437/219 |
| 61-137335 | 6/1986 | Japan .................................... 257/666 |
| 61-241948 | 10/1986 | Japan .................................... 437/219 |
| 62-24634 | 2/1987 | Japan .................................... 257/666 |
| 62-045159 | 7/1987 | Japan . |
| 62-196839 | 8/1987 | Japan . |
| 62-252271 | 11/1987 | Japan .................................... 257/686 |
| 62-210661 | 3/1988 | Japan . |
| 63-52455 | 3/1988 | Japan .................................... 257/666 |
| 63-92047 | 4/1988 | Japan . |
| 63-122159 | 5/1988 | Japan . |
| 63-185035 | 7/1988 | Japan .................................... 437/209 |
| 64-44027 | 2/1989 | Japan . |
| 1-105551 | 4/1989 | Japan . |
| 1-106436 | 4/1989 | Japan . |
| 1-123427 | 5/1989 | Japan . |
| 1-273343 | 11/1989 | Japan . |
| 2-031454 | 4/1990 | Japan . |
| 2-074046 | 5/1990 | Japan . |

(List continued on next page.)

Primary Examiner—P. W. Echols
Assistant Examiner—Adrian L. Coley
Attorney, Agent, or Firm—Finnegan, Henderson, Farabow, Garrett & Dunner, L.L.P.

[57] ABSTRACT

A semiconductor device having an interconnecting circuit board includes an island formed in a predetermined plane, a semiconductor chip disposed on the island and having a plurality of electrically connecting electrode pads, an interconnecting circuit board disposed on the semiconductor chip and having an electrically conductive pattern, a plurality of inner leads disposed around the island, a first electrically connecting wire connecting the electrically conductive pattern and one of the plurality of electrically connecting electrode pads, and a second electrically connecting wire connecting the electrically conductive pattern and one of the inner leads.

2 Claims, 9 Drawing Sheets

U.S. PATENT DOCUMENTS

| | | | |
|---|---|---|---|
| 1-123427 | 5/1990 | Japan . | |
| 2-150055 | 6/1990 | Japan | 437/209 |
| 2-168638 | 6/1990 | Japan | 437/209 |
| 2-271548 | 1/1991 | Japan . | |
| 2-294061 | 2/1991 | Japan . | |
| 3-64934 | 3/1991 | Japan . | |
| 0364934 | 3/1991 | Japan | 257/668 |
| 3-261153 | 11/1991 | Japan | 257/666 |
| 4106974 | 4/1992 | Japan | 257/690 |
| 4165689 | 6/1992 | Japan | 439/67 |
| 2144910 | 3/1985 | United Kingdom | 257/666 |

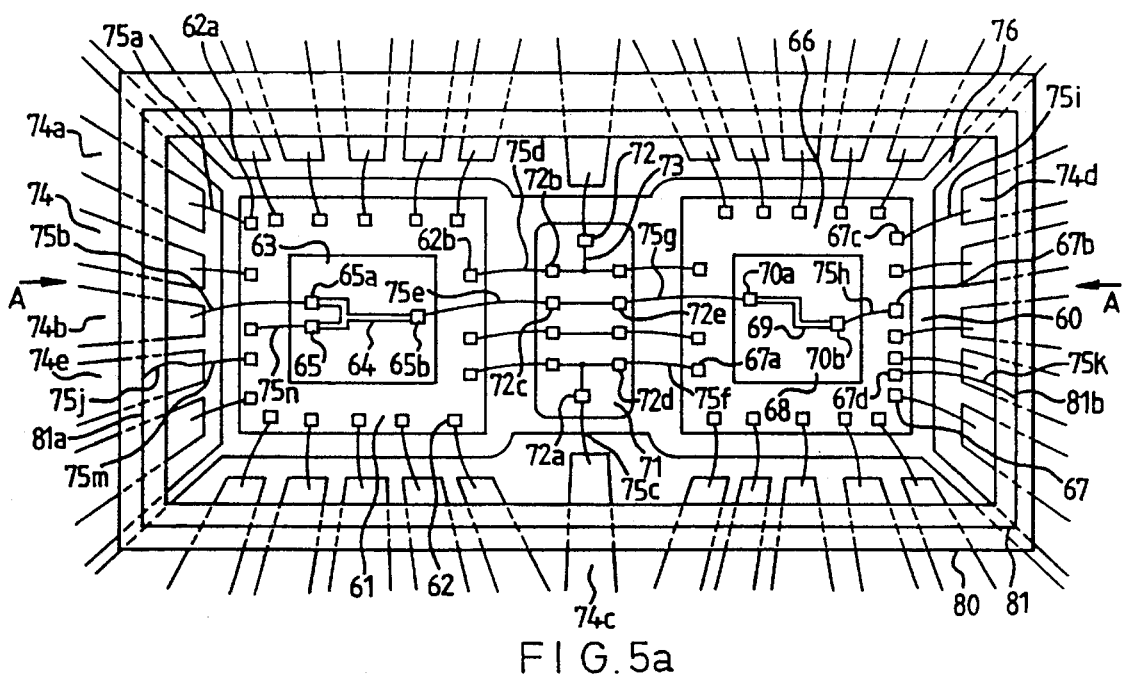
FIG. 5a
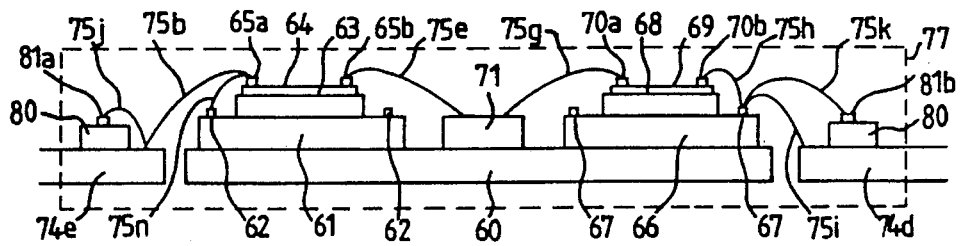
FIG. 5b
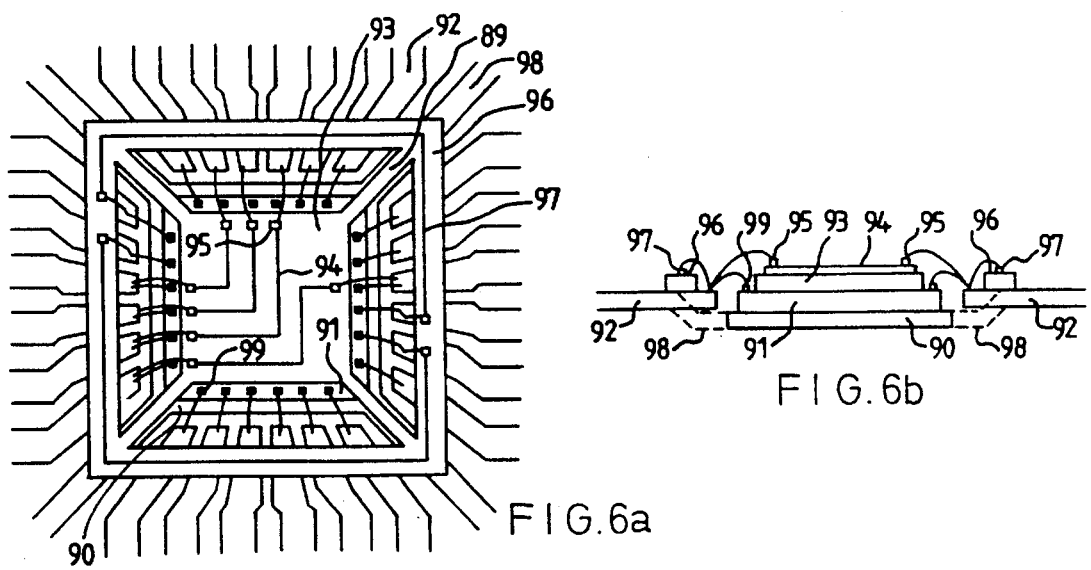
FIG. 6a
FIG. 6b

SEMICONDUCTOR DEVICE HAVING AN INTERCONNECTING CIRCUIT BOARD AND METHOD FOR MANUFACTURING SAME

This is a division of application Ser. No. 08/253,589 filed Jun. 3, 1994 now U.S. Pat. No. 5,473,514 which is a continuation of application Ser. No. 07/808,848, filed Dec. 17, 1991 now abandoned.

BACKGROUND OF THE INVENTION

1. Field of the Invention

The present invention relates to a semiconductor device and, more particularly, to a semiconductor device having an interconnecting circuit board and a method of manufacturing such a semiconductor device.

2. Description of the Related Art

FIG. 1 illustrates a top view of a semiconductor device 8 comprising a multichip conventional integrated circuit having a plurality of bipolar transistors.

Two semiconductor chips 10a and 10b are disposed on an island 11 of electrically conductive material which is connected to a lead frame by four support pins 12. Several inner leads 13 are disposed around island 11. A plurality of bonding wires 16 provide interconnecting functions. A circuit board 14 is disposed between semiconductor chips 10a and 10b and on island 11. A plurality of electrically conductive electrode pads 15 are disposed about the perimeter of semiconductor chips 10a and 10b and on circuit board 14. Bonding wires 16a are each electrically connected between one of pads 15 and an adjacent one of inner leads 13. Other bonding wires 16b are each electrically connected between one of the pads 15 on chips 10a and 10b facing circuit board 14 and one of the pads 15 on circuit board 14. Bonding wires 16a and 16b need to be short and should avoid touching undesired components. Thus, bonding wires 16a and 16b are electrically connected to only neighboring portions of chips 10a, 10b and board 14. Island 11, semiconductor chips 10a and 10b, circuit board 14, support pins 12, bonding wires 16a and 16b, and inner leads 13 are encapsulated by molded resin or encapsulated by a ceramic package.

In a conventional semiconductor device 8 as shown in FIG. 1, if there is need for electrically connecting an inner lead 13a which is disposed on the left side of FIG. 1 and an electrode pad 15a which is disposed on the right side of semiconductor chip 10b, a long bonding wire 16 is needed. However, a long bonding wire may connect undesired components, so that desired circuit functions may be disturbed. Therefore, long connections between one of the inner leads and one of the electrically connecting electrode pads are not achieved. Thus, in such conventional techniques, inner circuit elements of the semiconductor chips are designed such that there is no need to electrically connect the distant circuit elements. Moreover, the inner circuit elements of the semiconductor chips 10a and 10b must be redesigned frequently in order to accommodate placement of inner leads.

SUMMARY OF THE INVENTION

It is accordingly an object of the present invention to provide an improved semiconductor device which enables electrical connection between an electrically connecting electrode pad and an inner lead each disposed in distant portions without redesigning the inner circuitry of the semiconductor chip.

It is another object to provide a method of fabricating the improved semiconductor device.

According to a first aspect of the present invention there is provided a semiconductor device having an interconnecting circuit board. The semiconductor device comprises an island formed to a predetermined plane, a semiconductor chip having a plurality of electrically connecting electrode pads, the chip being disposed on the island; an interconnecting circuit board having an electrically conductive pattern, the board being disposed on the semiconductor chip; a plurality of inner leads disposed around the island; and means for providing selective interconnection between the chips, the interconnecting circuit board, and the plurality of inner leads electrode pads or one of the inner leads.

According to a second aspect of the present invention, there is provided a method of manufacturing a semiconductor device. The method comprises the steps of forming an island and a lead frame having a plurality of inner leads of conductive material; forming a first interconnecting circuit board having a first electrically connecting pattern and a plurality of electrically connecting electrode pads; forming a second interconnecting circuit board having a second electrically connecting pattern disposed thereon; mounting the first interconnecting circuit board 43 on a semiconductor chip having a desired electrical function and having a plurality of electrically connecting electrode pads; mounting the chip on the island; mounting a second interconnecting circuit board on the inner leads; forming an electrically connecting means between one of the inner leads and one of the electrically connecting electrode pads on the chip, and forming an electrically connecting means between another of the inner leads and another of the electrode pads; forming an electrically connecting means between one of the electrode pads and one portion of the second electrical connecting pattern; forming an electrically connecting means between one of the pads on the chip and the first pattern, and forming an electrically connecting means between one of the pads on the chip and one of the pads on the first pattern; and forming an electrically connecting means between one of the inner leads and the second electrically connecting pattern.

With the semiconductor device of the present invention, electrical connections between a desired inner lead and a desired electrode pad on the chip can be made by an interconnecting circuit board.

Other objects, features, and advantages of the present invention will become apparent from the following detailed description.

BRIEF DESCRIPTION OF THE DRAWINGS

FIG. 2b is a sectional view of the first embodiment shown in FIG. 2a;

FIG. 3b is a sectional view of the second embodiment shown in FIG. 3a;

FIG. 4b is a sectional view of the third embodiment shown in FIG. 4a;

FIG. 5a is a top view of fourth, fifth and sixth embodiments of this invention, having multiple semiconductor chips;

FIG. 5b is a sectional view of the fourth, fifth and sixth embodiments shown in FIG. 5a;

FIG. 6a is a top view of a seventh embodiment of this invention, having a single semiconductor chip;

FIG. 6b is a sectional view of the seventh embodiment shown in FIG. 6a;

FIG. 7b is a sectional view of the eighth embodiment shown in FIG. 7a;

FIG. 8b is a sectional view of the ninth embodiment shown in FIG. 8a;

FIG. 9b is a sectional view of the tenth embodiment shown in FIG. 9a;

DETAILED DESCRIPTION OF THE PREFERRED EMBODIMENTS AND METHODS

Figure 1:
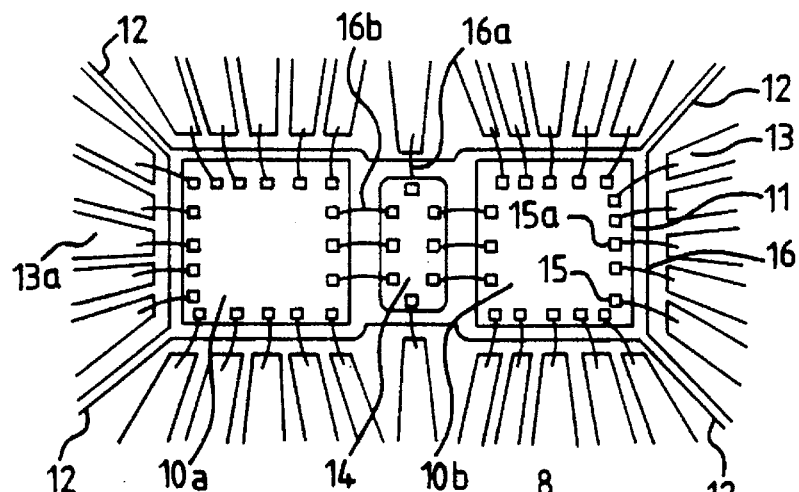
FIG. 1 is a top view of a conventional semiconductor device having multiple semiconductors chips.
Figure 2A:
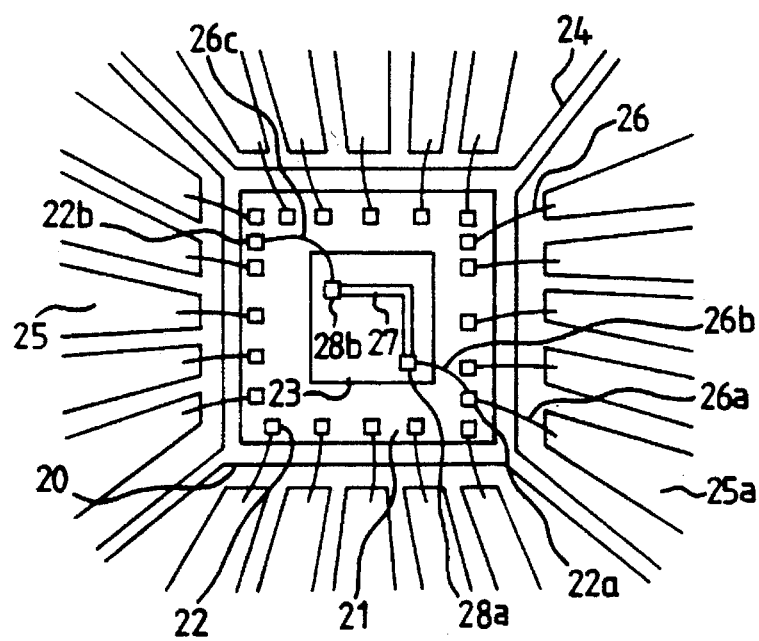
FIG. 2a is a top view of a first embodiment of this invention having a single semiconductor chip.
Figure 2B:
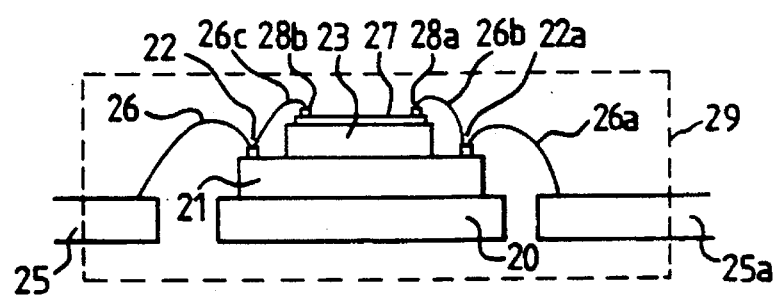

A first embodiment is shown in FIG. 2a and FIG. 2b. A semiconductor device includes an island 20 of electrically conductive material shaped to a flat plane. A semiconductor chip 21 is disposed on a center part of island 20, and includes a plurality of electrically connecting electrode pads 22 for accepting an input signal and supplying an output signal. An interconnecting circuit board 23 is disposed on semiconductor chip 21. Interconnecting circuit board 23 and semiconductor chip 21 are mechanically connected by bonding, e.g., by paste or glue. Island 20 is supported by four support pins 24, whereby island 20 is connected to a lead frame (not shown in FIGS. 2a and 2b).

A plurality of inner leads 25 are disposed around island 20. A plurality of bonding wires 26 connect electrically conducting electrode pads 22 and neighbor inner leads 25. Interconnecting circuit board 23 includes an electrically conductive pattern 27 and electrically connecting electrode pads, e.g., a first electrically connecting electrode pad 28a and a second electrically connecting electrode pad 28b connected to connecting pattern 27. Interconnecting circuit board 23 is made of glass epoxy or polyimide and electrically conductive pattern 27 is made of copper. A first inner lead 25a as shown in the right side of FIG. 2a and a first pad 22a, as shown right side of FIG. 2a are connected by a first wire 26a. A first pad 28a on the interconnecting circuit board 23 and the first pad 22a are connected by a second wire 26b. A second electrically connecting electrode pad 28b as shown on the left side of FIG. 2a and a second pad 22b as shown on the left side of FIG. 2a are connected by a third wire 26c. Thus, first inner lead 25a and a second pad 22b become electrically connected. Pattern 27 may have an electrical resistance or capacitance.

Electrically connecting electrode pads 22 and 28 may be made of nickel, copper, or gold.

These elements as described above are encapsulated by resin or ceramic 29, as shown in FIG. 2b.

As a result, a first inner lead and a second electrically connecting electrode pad which is spaced from the first inner lead can be electrically connected by using interconnecting circuit board 23.

As shown in FIG. 2b, interconnecting circuit board 23 is disposed on semiconductor chip 21, and not disposed beside chip 21. Thus, there is no need for additional space on island 20 to support interconnecting circuit board 23, thereby permitting a size reduction of island 20.

Figure 3A:
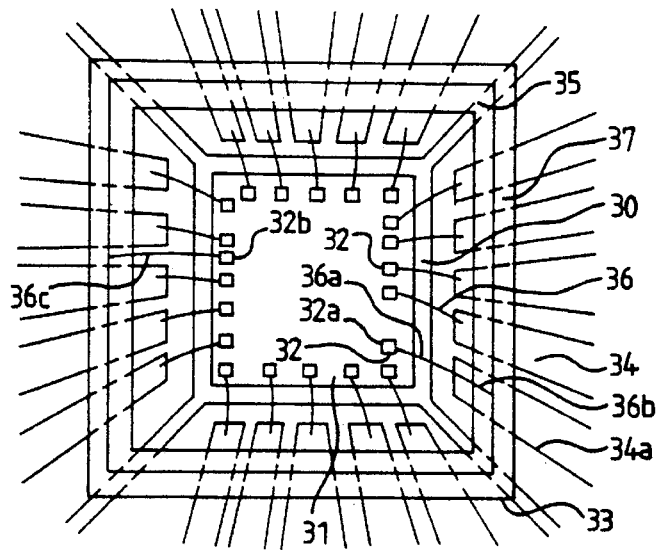
FIG. 3a is a top view of a second embodiment of this invention having a single semiconductor chip.
Figure 3B:
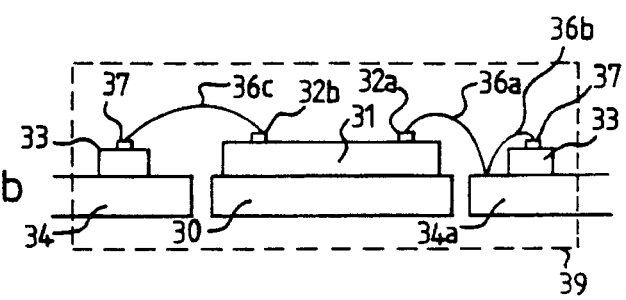

A second embodiment of this invention is shown in FIGS. 3a and 3b, and includes an interconnecting circuit board disposed on a semiconductor chip, as in the first embodiment, plus an interconnecting circuit board disposed on the inner leads.

In island 30 is shaped to a flat plane. A semiconductor chip 31, having a plurality of electrically connecting electrode pads 32, is disposed on the island 30. Pads 32 accept an input signal and supply an output signal. A plurality of inner leads 34 are disposed around the island 30. An interconnecting circuit board 33 having an electrically conductive pattern 37 entirely surrounding semiconductor chip 31 is disposed on the plurality of inner leads 34 and surrounds semiconductor chip 31. A plurality of electrically connecting means 36 such as wires or bonding tapes are connected between electrically conductive pattern 37 and one of the electrically connecting electrode pads 32 on chip 31 and between pattern 37 and one of inner leads 34.

Interconnecting circuit board 33 and inner leads 34 are mechanically connected by bonding, e.g., by paste or glue. Island 31 is supported by four support pins 35, whereby the island 30 is connected to a lead frame (not shown in FIGS. 3a and 3b).

A first inner lead 34a as shown on the right side of FIG. 3a and a first pad 32a as shown on the right side of FIG. 3a are connected by a first wire 36a. A first portion of a first inner lead 34a and electrically conductive pattern 37 of interconnecting circuit board 33 are connected by a second wire 36b. A second electrically connecting pad 32b as shown on the left side of FIG. 3a and a second adjacent portion of electrically conductive pattern 37 on the interconnecting circuit board 33 are connected by a third wire 36c. Thus, first inner lead 34a and a second pad 32b which are disposed apart from each other, may become electrically connected.

Electrically conductive pattern 37 may have an electrical resistance or capacitance.

These elements as described above are encapsulated by resin or ceramic 39 as shown in FIG. 3b.

This second embodiment uses the same material as above described of the first embodiment.

As a result, a first inner lead 34a and a second electrically connecting electrode pad 32b which is spaced from the first inner lead 34a can be electrically connected by using interconnecting circuit board 33. Because electrically conductive pattern 37 entirely surrounds chip 31, each pad can connect to any of inner leads 34.

Also, as shown in FIG. 3b, since interconnecting circuit board 33 is disposed on inner leads 34 and not disposed beside chip 31 on island 30, there is no need for space on island 30 to dispose the interconnecting circuit board 33, so size reduction of island 30 may be achieved.

This second embodiment has the advantage of strengthening the inner leads against over pressure, because the middle of the inner leads are connected to each other by interconnecting circuit board 33 made of glass epoxy or polyimide.

Figure 4A:
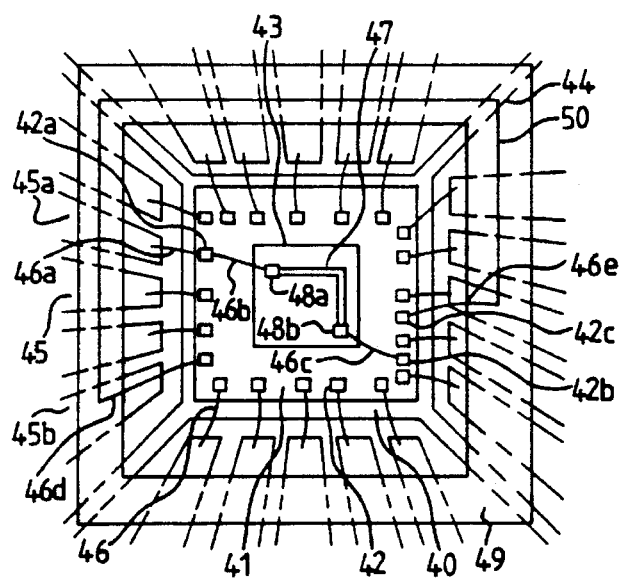
FIG. 4a is a top view of a third embodiment of this invention having a single semiconductor chip.
Figure 4B:
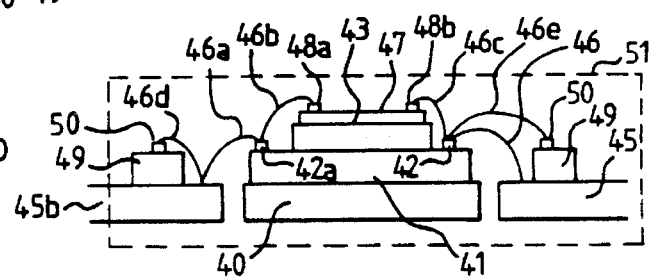

A third embodiment of this invention is shown as FIG. 4a and FIG. 4b, and includes both an interconnecting circuit board on the semiconductor chip and an interconnecting circuit board on the inner leads.

As seen in FIGS. 4a and 4b, an island 40 is shaped to a predetermined plane and is supported by four support pins 44, whereby the island 40 is connected to a lead frame (not shown). A semiconductor chip 41, having a plurality of electrically connecting electrode pads 42, is disposed on the island 40. Pads 42 accept an input signal or supply an output signal. A plurality of inner leads 45 is disposed around island 40 and semiconductor chip 41. A first interconnecting circuit board 43 having a first electrically conductive pattern 47 and a plurality of electrically connecting electrode pads 48 connected to pattern 47 is disposed on semiconductor chip 41. First electrically connecting means 46b, 46c, such as wires or bonding tape, connect one of electrically connecting electrode pads 42 and either electrically conductive pattern 47 or a first one of the inner leads 45. A second interconnecting circuit board 49 having a second electrically conductive pattern 50 partly surrounds the semiconductor chip 41, and is disposed on the plurality of the inner leads 45. Second interconnecting circuit board 49 and inner leads 45 are mechanically connected by bonding, e.g., by paste or glue. A second electrically connecting means 46e, 46d connects the second electrically conductive pattern 50 and a second one of the electrically connecting electrode pads 42c or a second one of the inner leads 45. Also, first interconnecting circuit board 43 and the semiconductor chip 41 are mechanically connected by bonding, e.g., by paste or glue.

A first inner lead 45a, shown on the left side in FIG. 4a, and a first pad 42a, shown on the left side in FIG. 4a, are connected by a first wire 46a. A first electrically connecting electrode pad 48a on interconnecting circuit board 43, adjacent first pad 42a, and the first pad 42a are connected by a second wire 46b. A second pad 48b on the first interconnecting board 47 and a neighboring second pad 42b on chip 41, as shown right side in FIG. 4a, is connected by a third wire 46c. Thus, even though widely separated, first lead 45a and second pad 42b become electrically connected. Note that chip 41 includes a plurality of pads 42 each corresponding to one of leads 45, and further includes at least one additional pad 42b which does not correspond to an inner lead 45.

A second inner lead 45b as shown in FIG. 4a and a first portion of electrically conductive pattern 50 on second interconnecting circuit board 49, adjacent to second lead 45b, is connected by a fourth wire 46d. A third pad 42c on chip 41 and a second portion of the electrically conductive pattern 50 adjacent third pad 42c on second interconnecting circuit board 49 are connected by fourth wire 46e.

First electrically conductive pattern 47 and second electrically conductive pattern 50 may have an electrical resistance or capacitance.

These elements as described above are encapsulated by resin or ceramic 51 as shown in FIG. 4b.

This third embodiment uses same material as described above with respect to the first embodiment.

As a result, a first inner lead 45a and a second electrically connecting electrode pad 42b which is spaced from the first inner lead 45a can be electrically connected using the first interconnecting circuit board 43, and second inner lead 45b and third electrically connecting electrode pad 42c which is spaced from the second inner lead 45b can be electrically connected using the second interconnecting circuit board 49. Electrically conductive pattern 50 may either entirely surround chip 41 or partly surround chip 41.

As shown in FIG. 4b, interconnecting circuit boards 43 and 49 are respectively disposed on chip 41 or on inner leads 45, and not disposed beside the chip 41. Thus, there is no need for space on island 40 to dispose the interconnecting circuit board 43, 49, thereby achieving a size reduction of the island 40.

A fourth embodiment of this invention is shown as FIG. 5a and FIG. 5b. FIG. 5b shows a side view of the semiconductor device of FIG. 5a in a direction of arrow A in FIG. 5a.

A semiconductor device having an interconnecting circuit board comprises an island 60 shaped to predetermined plane, a first semiconductor chip 61 having a plurality of electrically connecting electrode pads 62 and disposed on island 60, and a first interconnecting circuit board 63 having an electrically conductive pattern 64. Board 63 has a plurality of electrically connecting electrode pads 65 (65a and 65b) which are connected to pattern 64. A second semiconductor chip 66 has a plurality of electrically connecting electrode pads 67 and is disposed on island 60. A second interconnecting circuit board 68 is disposed on second semiconductor chip 66 and has an electrically conductive pattern 69 with a plurality of electrically connecting electrode pads 70 (70a and 70b) connected to electrically conductive pattern 69. An electric connecting circuit board 71 has a plurality of electrically connecting electrode pads 72 and an electrically conductive pattern 73 connected to pads 72. Circuit board 71 is disposed on island 60 between chips 61 and 66. Circuit board 71 is made of glass, epoxy or polyimide.

A plurality of inner leads 74 is disposed around the island 60. A first electrically connecting means, e.g., wire 75a, connects the first one 74a of the inner leads and the first one 62a of the electrically connecting electrode pads on first semiconductor chip 61. A second electrically connecting means, e.g., wire 75b, connects a second one 74b of the inner leads and a first one 65a of the electrically connecting electrode pads on first interconnecting circuit board 63. A third electrically connecting means, e.g., wire 75c, connects a third one 74c of the inner leads and a first one 72a of the electrically connecting electrode pads on the circuit board 71. A fourth electrically connecting means, e.g., wire 75d, connects a second one 62b of electrically connecting electrode pads on first semiconductor chip 61 and a second one 72b of the electrically connecting electrode pads on circuit board 71. A fifth electrically connecting means, e.g., wire 75e, connects a second one 65b of the electrically connecting electrode pads on first interconnecting circuit board 63 and a third one 72c of the electrically connecting electrode pads on the circuit board 71. A sixth electrically connecting means, e.g., wire 75f, connects a fourth electrically connecting electrode pad 72d on circuit board 71 and a first one 67a of the electrically connecting electrode pads on second chip 66. A seventh electrically connecting means, e.g., wire 75g, connects a fifth one 72e of the electrically connecting electrode pads on the electric connecting circuit board 71 and a first one 70a of the electrically connecting electrode pads on second interconnecting circuit board 68. An eighth electrically connecting means, e.g., wire 75h, connects a second one 70b of the electrically connecting electrode pads on second interconnecting circuit board 68 and a second one 67b of the electrically connecting electrode pads on second chip 66. A ninth electrically connecting means, e.g., wire 75i, connects a third one 67c of the electrically connecting electrode pads on the second chip 66 and a fourth one 74d of the inner leads.

Semiconductor chips 61 and 66 are disposed on island 60, and have a plurality of electrically connecting electrode pads 62, 67, respectively, for accepting an input signal and outputting an output signal.

Interconnecting circuit boards 63 and 68 and semiconductor chips 61 and 66 are mechanically connected by bonding, e.g., by paste or glue. Island 60 is supported by four support pins 76 at four corners, whereby the island 60 is connected to a lead frame (not shown).

Each electrical pattern 64, 69, 73 may have an electrical resistance or capacitance.

These elements as described above are encapsulated by resin or ceramic 77 as shown in FIG. 5b.

This fourth embodiment uses same material as described with report 40 above the first embodiment.

As a result, second inner lead 74b and second electrically connecting electrode pad 67b on the second chip 66 which is spaced from the second inner lead 74b are connected using first interconnecting circuit board 63, the circuit board 71, and second interconnecting circuit board 68.

Although the fourth embodiment shown in FIGS. 5a and 5b includes off-chip interconnect board 71, certain applications may not require board 71, and electrical connections may be made directly between pads 62 and 67 of chips 61 and 66. Also, direct electrical connection between boards 63 and 68 may be made.

As shown in FIG. 5b, interconnecting circuit boards 63 and 68 are respectively disposed on chips 61 and 66, and are not disposed beside chips 61 and 66. Thus, there is no need for space on island 60 to dispose the interconnecting circuit boards 63 and 68, and a reduction in the size of island 60 may be achieved.

A fifth embodiment of this invention is also shown in FIG. 5a and 5b. The fifth embodiment comprises a semiconductor device having all elements of the fourth embodiment and further comprising a third interconnecting circuit board 80 having electrically connecting circuit pattern 81 entirely surrounding island 60. The fifth embodiment also includes a tenth connecting means, e.g. wire 75j, for connecting a fifth inner lead 74e and a first portion 81a of electrically conductive pattern 81, and an eleventh electrically connecting means, e.g., wire 75k for connecting a second portion 81b and a fourth electrically connecting electrode pad 67d. Thus, fifth inner lead 74e and the fourth pad 67d become electrically connected even though they are physically separated.

Interconnecting circuit board 80 and the inner leads are mechanically connected by appropriate bonding techniques, e.g., using paste or glue.

Electrically conductive pattern 81 may have an electrical resistance or capacitance.

These elements as described above are encapsulated by resin or ceramic 77, as shown in FIG. 5b.

As shown in FIG. 5b, all of the interconnecting circuit boards 63, 68, 80 are disposed on chips 61, 66, or on inner leads 74, and are not disposed beside the chips 61, 66 on the island 60. Thus, there is no need for space on the island 60 to dispose interconnecting circuit boards 63, 68, 80, and a reduction in the size of island 60 may be achieved.

A sixth embodiment of this invention is also shown in FIG. 5a and FIG. 5b. This embodiment excludes first interconnecting circuit board 63 and second interconnecting circuit board 68 of the fifth embodiment. This embodiment has the same merits as the fifth embodiment, excluding the merits of the first interconnecting circuit board 63 and the second interconnecting circuit board 68.

Other variations of embodiments having multiple semiconductor chips are available. For example, circuit board 71 may be excluded from the device. In that case, pads of chips 61, 66 which face each other are connected directly by wires without using circuit board 71. Thus, even greater size reductions of island 60 may be achieved. Also, board 80 may only partially surround island 60.

Although the embodiments shown in FIGS. 5a and 5b include only two chips, additional chips, including corresponding electrical interconnections, may, of course, be employed in appropriate applications.

A seventh embodiment of this invention is shown as FIG. 6a and FIG. 6b. A semiconductor device according to this embodiment comprises an island 90 formed in a predetermined plane, and a semiconductor chip 91 disposed on island 90 having a plurality of electrically connecting electrode pads 99. A plurality of inner leads 92 is disposed around island 90. A first interconnecting circuit board 93 is disposed on chip 91 having an electrically conductive pattern 94 and a plurality of electrically connecting pads 95 connected to the electrically conductive pattern 94. A second interconnecting circuit board 96 is disposed on inner leads 92 and has an electrically conductive pattern 97 on the upper side thereof. Connecting pattern 97 can be the same as pattern 50 in the third embodiment, shown in FIGS. 4a and 4b. A difference between this embodiment and the third embodiment is that island 90 of FIGS. 6a and 6b is depressed below the plane of inner leads 92. First interconnecting circuit board 93 and second interconnecting board 96 are mechanically connected by support pins 98 and are formed on the same plane. Pads on chip 91 and a tip of inner leads 92 are exposed in the opening between interconnecting circuit board 93 and interconnecting structure 96.

This embodiment has a first advantage of strengthening the structure of second interconnecting board 96, because interconnecting board 93 and interconnect board 96 are in the same plane and are respectively supported by chip 91 and support pin 98. A second advantage of this embodiment is that tape automated bonding (TAB) may be employed for connecting between the desired electrically connecting pads 95 on the circuit board 93 and the desired inner lead 92, because the two connecting portions are disposed on the same plane. The TAB material is formed of a copper lead for providing the functions of electrical connection and polyimide tape connected to one side of the copper lead for providing the function of mechanical support. The use of TAB has the advantage of permitting a reduction in spacing between the pads on chip 91.

Figure 7A:
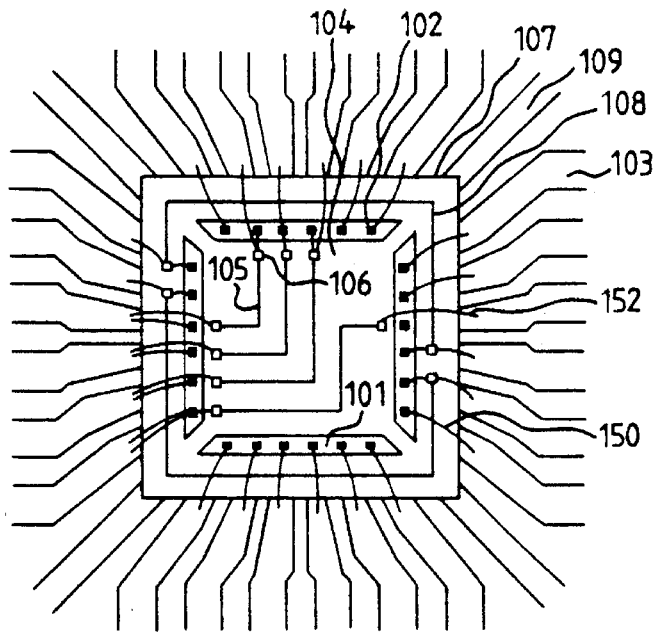
FIG. 7a is a top view of an eighth embodiment of this invention, having a single semiconductor chip.
Figure 7B:
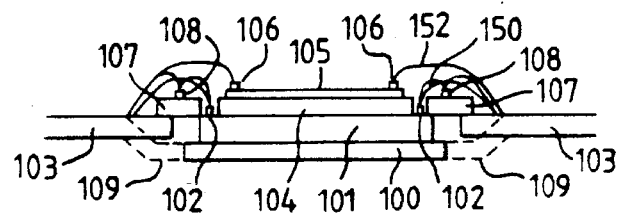

An eighth embodiment of this invention is shown as FIG. 7a and FIG. 7b. In this embodiment, a semiconductor device comprises an island 100, a semiconductor chip 101 disposed on island 100 and having a plurality of electrically connecting electrode pads 102, a plurality of inner leads 103 around island 100, a first interconnecting circuit board 104 disposed on chip 101 and having an electrically conductive pattern 105 and a plurality of electrically connecting pads 106 connected to pattern 105, and a second interconnecting circuit board 107 disposed on the inner leads 103. Second interconnecting circuit board 107 has an electrically conductive pattern 108 on its upper side. Island 100 is supported by support pins 109, and is connected to a lead frame (not shown).

Connecting pattern 105 can be the same as in the third embodiment. A difference between this embodiment and the third embodiment is that island 100 is depressed from the inner leads 103, and first interconnecting circuit board 104 and second interconnecting circuit board 107 are integrally formed in a unitary structure and are coplanar with one another. Island 100 and the tips of inner leads 103 are both entirely covered by either the first interconnecting circuit board 104 or second interconnecting current board 107.

A difference between the eighth embodiment and the seventh embodiment is connections 150 between pads 102 on the chip 101 and inner leads 103, and connections 152 between pads 106 on first interconnecting circuit board 104 and inner leads 103, which connections pass over interconnecting circuit board 107.

Figure 8A:
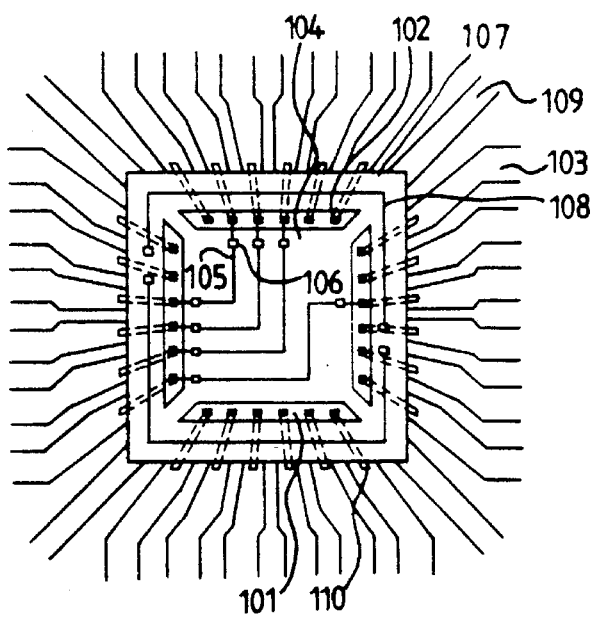
FIG. 8a is a top view of a ninth embodiment of this invention, having a single semiconductor chip.
Figure 8B:
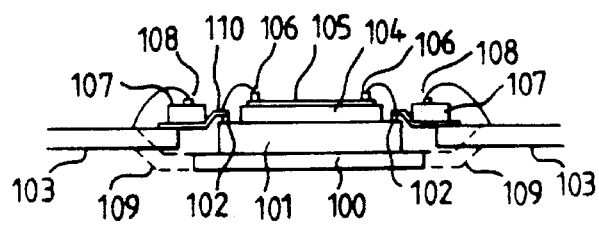

A ninth embodiment of this invention is shown as FIG. 8a and FIG. 8b. This embodiment comprises essentially the same elements as the eighth embodiment. However, connections between pads 102 on chip 101 and the inner leads 103 are provided by TABs 110, and interconnecting circuit board 107 is not mechanically connected to chip 101. Interconnecting circuit board 107 is separated from inner lead 103 by TAB 110, such that the under plane of interconnecting circuit board 107 is higher than upper plane of inner leads 103 by the thickness of TABs 110.

Figure 9A:
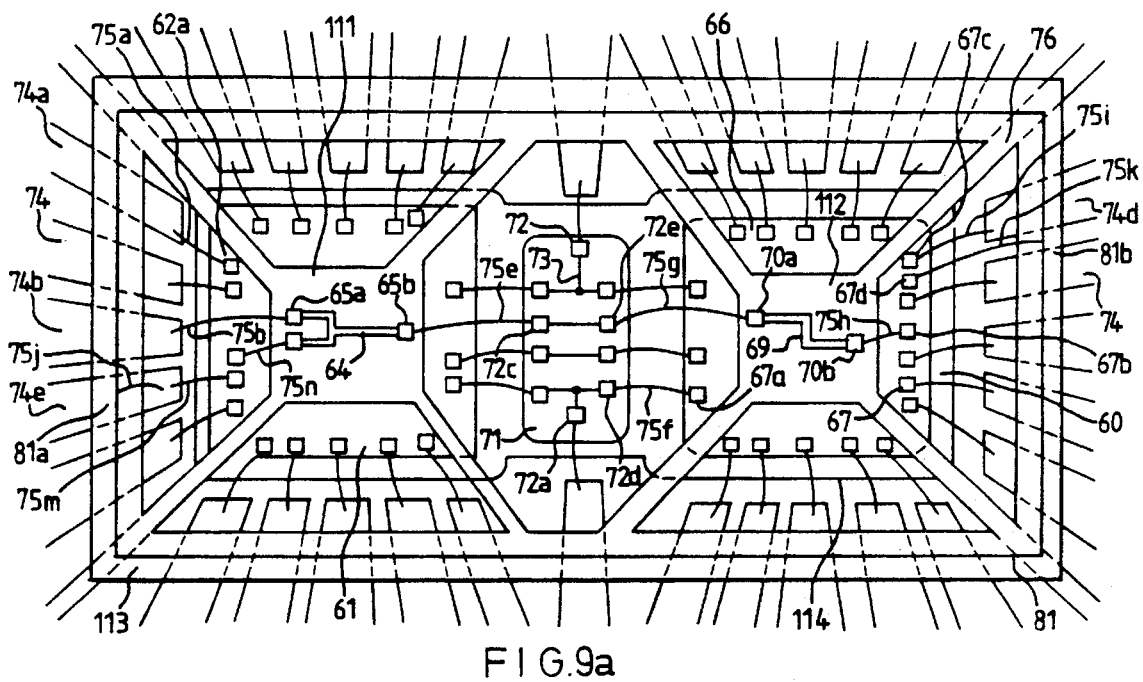
FIG. 9a is a top view of a tenth embodiment of this invention, having multiple semiconductor chips.
Figure 9B:
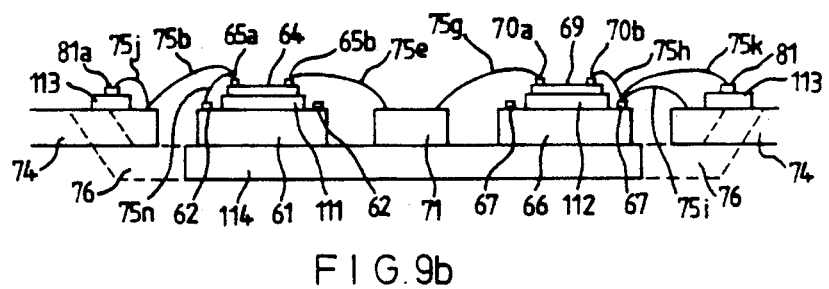

A tenth embodiment of this invention is shown in FIGS. 9a and 9b. This embodiment comprises essentially the same elements as the fourth embodiment, shown in FIGS. 5a and 5b. However, a first interconnecting circuit board 111, a second interconnecting circuit board 112, and a third interconnecting circuit board 113 are mechanically connected to each other by support pins 76 and have coplanar lower surfaces. An island 114 is depressed from inner leads 74.

This embodiment has an advantage of strengthening of structure of second interconnecting circuit board 113, because two interconnecting boards are connected by support pins 76. A second advantage of this embodiment is that tape-automated bonding (TAB) may be used for connecting between desired electrically connecting pads on the chip and the desired inner lead 74, because the two connected portions are disposed in the same plane. The TAB material is formed from copper lead providing the functions of electrical connection, and polyimide tape connected to one side of the copper lead for providing mechanical support. The use of TAB has the advantage of reducing the interval or spacing of the pads on the chip.

Figure 10A:
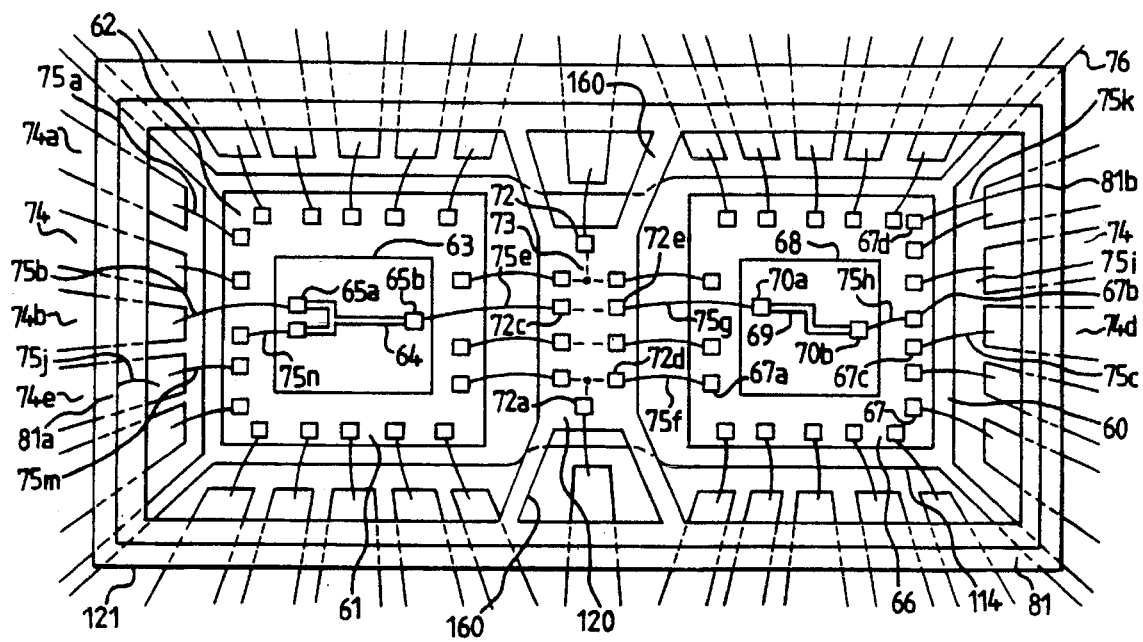
FIG. 10a is a top view of an eleventh embodiment of this invention, having multiple semiconductor chips.
Figure 10B:
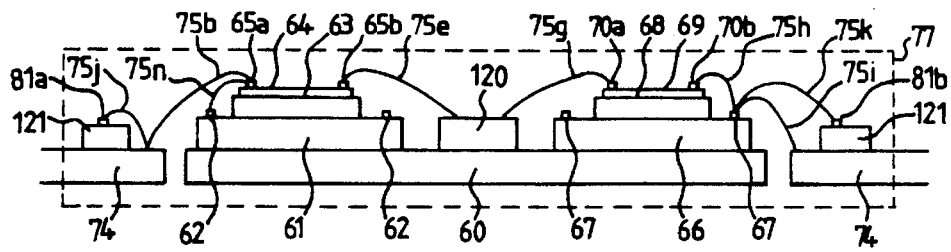
FIG. 10b is a sectional view of the eleventh embodiment shown in FIG. 10b.

An eleventh embodiment of this invention is shown in FIGS. 10a and 10b.

This embodiment comprises essentially the same elements as the fourth embodiment, shown in FIGS. 5a and 5b. However, a connecting circuit board 120 and a surrounding interconnecting circuit board 121 are mechanically connected to each other by support pins 160. Also, circuit boards 120 and 121 have coplanar lower surfaces, and are integrally formed as a unitary structure. Further, island 60 is not depressed from inner leads 74.

This embodiment has the advantage of strengthening the structure of the interconnecting circuit board 121, because interconnecting circuit board 121 is connected to circuit board 120.

FIGS. 11a through 11i illustrate a preferred method of manufacturing a semiconductor device of the seventh embodiment in accordance with the invention.

Figure 11A:
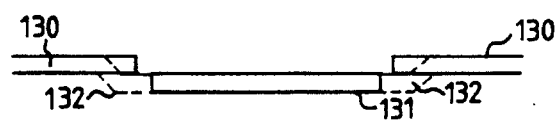
FIGS. 11a–11i are sectional views showing steps in a first preferred method for manufacturing a semiconductor device in accordance with the invention.

In a first step, as shown in FIG. 11a, a lead frame having a plurality of inner leads 130 is provided. An island 131 is formed by depressing a portion of the lead frame. Island 131 is connected to the remainder of the lead frame by a plurality support pins 132.

Figure 11B:
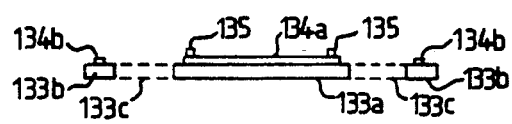

In a second step, as shown in FIG. 11b, a unitary interconnecting circuit board structure is formed, which includes a center part 133a and an outer part 133b connected by a support pin (not shown). An opening 133c is formed between parts 133a and 133b. A first electrical connecting pattern 134a is formed on the center part 133a and a plurality of electrical connecting electrode pads 135 are formed on center part 133a. A second electrically conductive pattern 134b is formed on the outer part 133b.

Figure 11C:
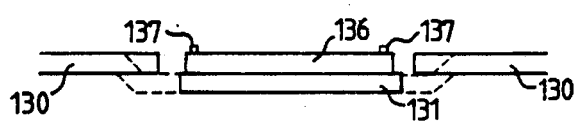

In a third step, as shown in FIG. 11c, a semiconductor chip 136 having a desired electrical function and a plurality of electrically connecting electrode pads 137 is mounted on island 131, whereby chip 136 and island 131 are physically connected.

Figure 11D:
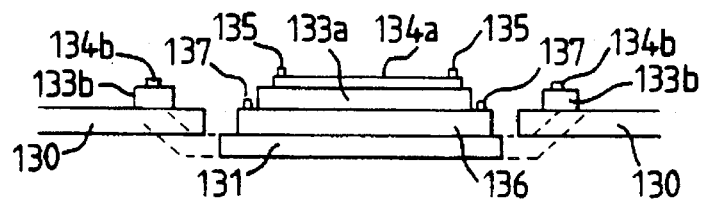

In a fourth step, as shown in FIG. 11d, center part 133a is mounted on chip 136, and outer part 133b is mounted on inner leads 130. Any appropriate mounting technique, such as gluing or bonding may be employed.

Figure 11E:
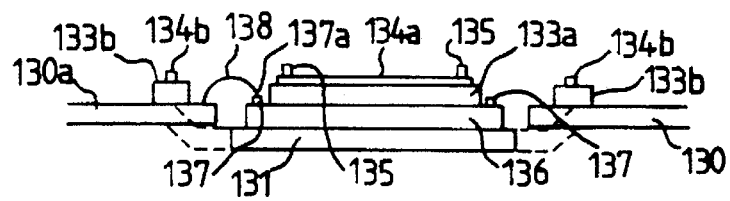

In a fifth step, as shown in FIG. 11e, a first inner lead 130a and first electrically connecting electrode pad 137a on chip 136 are connected with an electrically conductive material, e.g., wire on TAB 138.

Figure 11F:
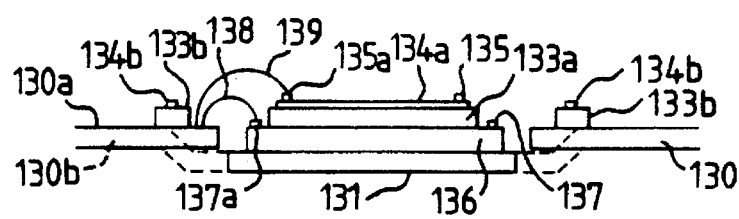

In a sixth step, as shown in FIG. 11f, a second inner lead 130b (hidden by lead 130a in FIG. 11f) and a first electrically connecting electrode pad 135a on the interconnecting circuit board 133a on chip 136 are connected with similar electrically conductive material 139.

Figure 11G:
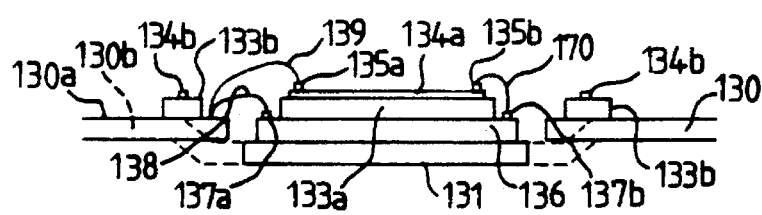

In a seventh step, as shown in FIG. 11g, a second electrically connecting electrode pad 135b on center part 133a of the interconnecting circuit board and a second electrically connecting electrode pad 137b on chip 136 with electrically conductive material, e.g., wire 170.

Figure 11H:
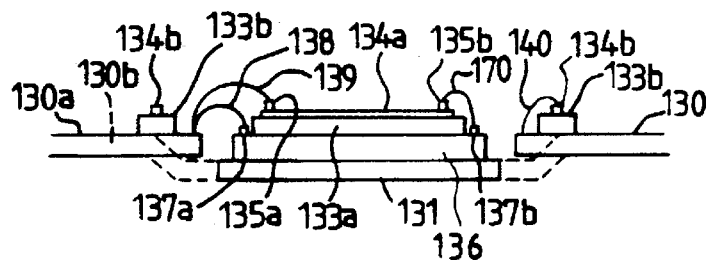

In an eleventh step, as shown in FIG. 11h, a third inner lead 130c and electrically conductive pattern 134b on the outer part 133b of the interconnecting circuit board are connected with electrically conductive material, e.g., wire 140.

Figure 11I:
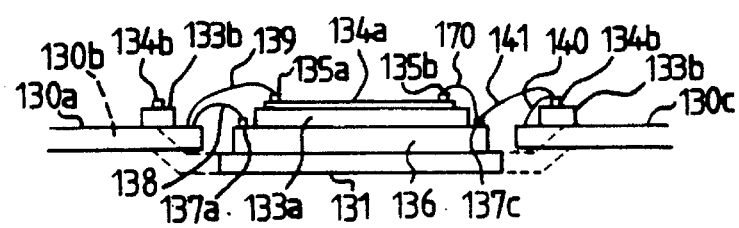

In a twelfth step, as shown FIG. 11i, electrically conductive pattern 134b on the interconnecting circuit board 133b on the inner lead 130c and a third electrically connecting electrode pad 137c as on chip 136 are connected with wire 141.

An advantage of this method is that the step of connecting the interconnecting circuit board 133a and interconnect structure 133b to the chip 136 and the inner lead 130 is simultaneously performed. Thus, the number of manufacturing steps of the semiconductor device is reduced.

Another advantage is that interconnections can be performed on two portions which are located apart in the vertical direction. Because the step of connecting to the lower portion is performed first, and the step of connection to the higher portion is performed second, the two connection means are not in contact with each other.

This method of manufacturing a semiconductor device is available for semiconductor devices having other structures, e.g., the first to eleventh embodiments described above.

Figure 12A:
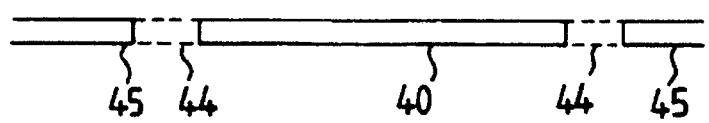
FIGS. 12a–12j are sectional views showing steps in a second preferred method for manufacturing a semiconductor device in accordance with the invention.

FIGS. 12a–12j illustrate a preferred method for manufacturing the semiconductor device of FIGS. 4a and 4b, which constitutes the previously described third embodiment. In a first step as shown in FIG. 12a, an island 40 and a lead frame having a plurality of inner leads 45 are formed of conductive material. Island 40 is connected to the lead frame via support pins 44.

Figure 12B:
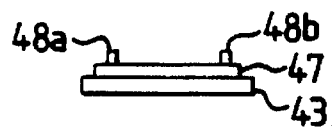

In a second step, as shown in FIG. 12b, a first interconnecting circuit board 43 is formed having a first electrically connecting pattern 47 and a plurality of electrically connecting electrode pads 48a, 48b.

Figure 12C:
Figure 12C:

In a third step, as shown in FIG. 12c, a second interconnecting circuit board 49 is formed having a second electrically connecting pattern 50 disposed thereon.

Figure 12D:
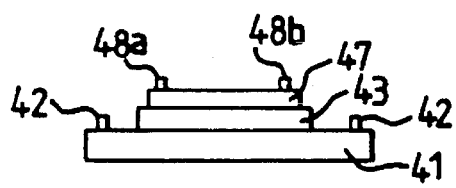

In a fourth step, as shown in FIG. 12d, first interconnecting circuit board 43 is mounted on a semiconductor chip 41 having a desired electrical function and having a plurality of electrically connecting electrode pads 42. First interconnecting circuit board 43 is mounted to chip 41 by suitable means, such as bonding with paste or glue.

Figure 12E:
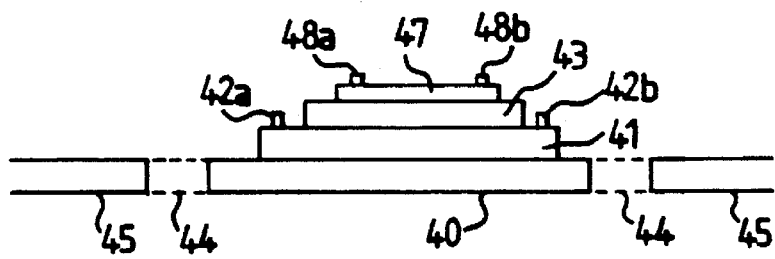

In a fifth step, as shown in FIG. 12e, chip 41 is mounted to island 40 by suitable means, such as bonding with paste or glue.

Figure 12F:
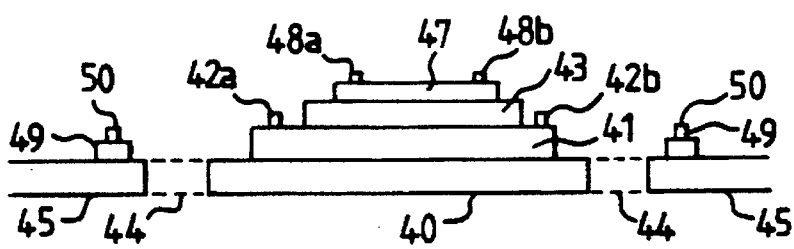

In a sixth step, as shown in FIG. 12f, second interconnecting circuit board 49 is mounted on inner leads 45.

Figure 12G:
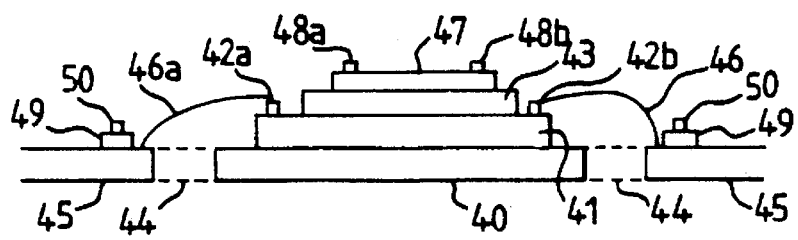

In a seventh step, as shown in FIG. 12g, an electrically connecting means such as a wire 46a is formed between an inner lead 45a and an electrically connecting electrode pad 42a on chip 41, and an electrically connecting means 46 is formed between another inner lead 45b and an electrode pad 42b.

Figure 12H:
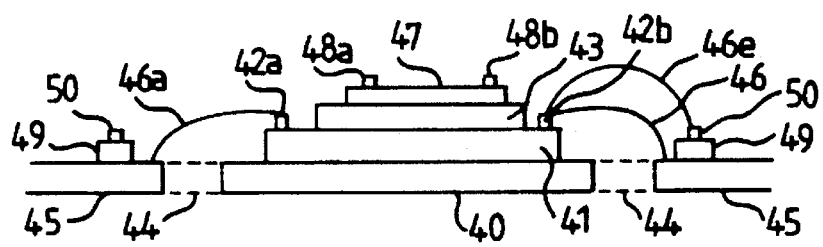

In a eighth step, as shown in FIG. 12h, an electrically connecting means 46e is formed between electrically connecting electrode pad 42b and one portion of second electrical connecting pattern 50.

Figure 12I:
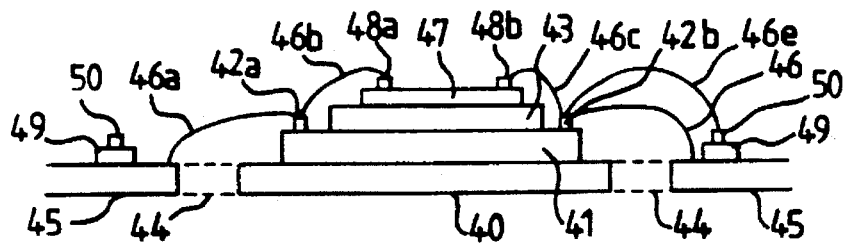

In a ninth step, as shown in FIG. 12i, an electrically connecting means 46b is formed connecting a pad 42a on chip 41 and a pad 48a on first pattern 47, and an electrically connecting means 46c is formed between pad 42b and a pad 48b.

Figure 12J:
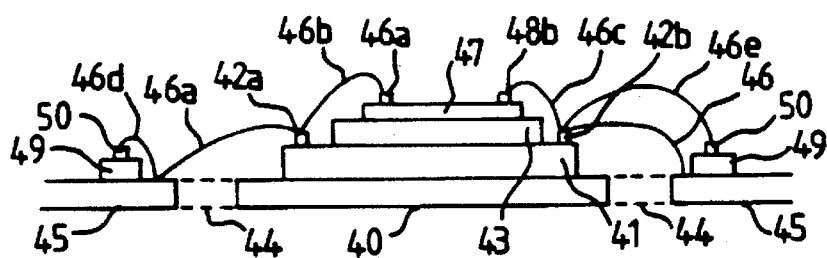

In a tenth step, as shown in FIG. 12j, an electrically connecting means, for example, wire 46d, is formed between inner lead 45 and second electrically connecting pattern 50 on second interconnecting circuit board 49.

The method described above provides the ability to connect two portions of the semiconductor device which are vertically separated. Since the step of connecting the lower portions preferably is performed first and the step of connecting the upper portions preferably is performed later, undesired connections between the connecting means are avoided.

Numerous modifications and variations of the present invention are possible in light of the above teachings. It is therefore to be understood that, within the scope of the appended claims, the present invention can be practiced in a manner other than as specifically described herein.

What is claimed is:

1. A method of manufacturing a semiconductor device, the method comprising the steps of:

providing a lead frame having a plurality of inner leads, an island depressed from the inner leads and connected to a plurality of support pins;

providing an interconnecting circuit board having an opening defining a center part and an outer part of the interconnecting circuit board, a plurality of electrically connecting electrode pads, and an electrically conductive pattern electrically connected to the electrically connecting electrode pads;

providing a semiconductor chip on the island, the semiconductor chip having a desired electrical function and a plurality of electrically connecting electrode pads;

mounting the interconnecting circuit board on the chip and the inner leads;

connecting a first one of the inner leads and a first one of the electrically connecting electrode pads on the chip with an electrically conductive material;

connecting a second one of the inner leads and a first one of the electrically connecting electrode pads on the interconnecting circuit board on the chip with an electrically conductive material;

connecting a second one of the electrically connecting electrode pads on the interconnecting circuit board on the chip and a second one of the electrically connecting electrode pads on the chip with an electrically conductive material;

connecting a third one of the inner leads and an electrically conductive pattern on the interconnecting circuit board on the inner leads; and connecting the electrically conductive pattern on the interconnecting circuit board on the inner leads and a third one of the electrically connecting electrode pads on the chip.

2. A method of manufacturing a semiconductor device, the method comprising the steps of:

forming an island and a lead frame having a plurality of inner leads of conductive material;

forming a first interconnecting circuit board having a first electrically connecting pattern and a plurality of electrically connecting electrode pads;

forming a second interconnecting circuit board having a second electrically connecting pattern disposed thereon;

mounting the first interconnecting circuit board 43 on a semiconductor chip having a desired electrical function and having a plurality of electrically connecting electrode pads;

mounting the chip on the island;

mounting a second interconnecting circuit board on the inner leads;

forming an electrically connecting means between one of the inner leads and one of the electrically connecting electrode pads on the chip, and forming an electrically connecting means between another of the inner leads and another of the electrode pads;

forming an electrically connecting means between one of the electrode pads and one portion of the second electrical connecting pattern;

forming an electrically connecting means between one of the pads on the chip and the first pattern, and forming an electrically connecting means between one of the pads on the chip and one of the pads on the first pattern; and forming an electrically connecting means between one of the inner leads and the second electrically connecting pattern.

\* \* \* \* \*